United States Patent [19]
Manning

[11] Patent Number: 5,818,780
[45] Date of Patent: Oct. 6, 1998

[54] MEMORY DEVICE WITH DISTRIBUTED VOLTAGE REGULATION SYSTEM

[75] Inventor: Troy A. Manning, Boise, Id.

[73] Assignee: Micron Technology, Inc., Boise, Id.

[21] Appl. No.: 717,170

[22] Filed: Sep. 20, 1996

Related U.S. Application Data

[63] Continuation of Ser. No. 515,485, Aug. 15, 1995, Pat. No. 5,574,697.

[51] Int. Cl.$^6$ ....................................................... G11C 8/00
[52] U.S. Cl. ....................... 365/226; 365/228; 365/189.09
[58] Field of Search ..................................... 365/226, 227, 365/228, 51, 63, 189.06, 189.09

[56] References Cited

U.S. PATENT DOCUMENTS

| | | | |
|---|---|---|---|
| 4,855,613 | 8/1989 | Yamada et al. | 365/226 |
| 5,307,318 | 4/1994 | Nemoto | 365/226 |
| 5,335,203 | 8/1994 | Ishii et al. | 365/226 |

*Primary Examiner*—David C. Nelms
*Assistant Examiner*—Vu A. Le
*Attorney, Agent, or Firm*—Seed and Berry LLP

[57] ABSTRACT

A memory device includes a memory cell array, control circuits, and a voltage regulation system. The voltage regulation system includes an array power bus distributing an array supply voltage to the array, and a control circuit power bus distributing a control circuit supply voltage to the control circuits. Regulator circuits are coupled to the array power bus at spaced-apart locations along the bus which allow each regulator circuit to respond independently to a localized variation in the array supply voltage. Other regulator circuits are similarly coupled to the control circuit power bus. The regulator circuits which are unneeded for a particular operating mode of the memory device can be turned off during active memory cycles, and all the regulator circuits can be turned off during stand-by memory cycles. A resistor couples the array and control circuit power busses, and a low-power regulator circuit is coupled to the control circuit power bus to maintain both the array and control circuit supply voltages during stand-by memory cycles while the regulator circuits are off. The voltage regulation system thus advantageously reduces the power consumption of the memory device by using the low-power regulator circuit alone during stand-by memory cycles, reduces noise from the array on the control circuit supply voltage by splitting the array and control circuit power busses, and provides more responsive regulation of the array and control circuit supply voltages by distributing the regulator circuits.

69 Claims, 3 Drawing Sheets

MEMORY DEVICE WITH DISTRIBUTED VOLTAGE REGULATION SYSTEM

CROS-REFERENCE TO RELATED APPLICATION

This application is a continuation of U.S. patent application Ser. No. 08/515,485, filed Aug. 15, 1995, U.S. Pat. No. 5,574,697.

TECHNICAL FIELD

This invention relates in general to memory devices, and in particular to memory devices with voltage regulators.

BACKGROUND OF THE INVENTION

Modern memory devices, such as dynamic random access memories (DRAMs), often include an internal voltage regulator to derive a regulated internal supply voltage from an external supply voltage. This internal supply voltage is typically provided to the memory device's memory cell array and to the array's peripheral control circuits on a common power bus.

This typical voltage regulation system can be problematic for three reasons. First, the common power bus can be very long in a modern memory device. As a result, localized variations in the internal supply voltage along the bus can go unregulated by the internal voltage regulator. Second, sudden current draws from the common power bus by the memory cell array at the beginning of active cycles of the memory device can produce noise in the internal supply voltage which can affect operation of the array's peripheral control circuits. Third, the typical internal voltage regulator uses power relatively inefficiently.

Therefore, there is a need in the art for a memory device with a voltage regulation system which provides responsive regulation of the internal supply voltage along the entire length of the power bus. The system should also reduce the effect noise from the memory cell array has on operation of the array's peripheral control circuits, and it should use power more efficiently.

SUMMARY OF THE INVENTION

The present invention provides a memory device comprising a memory cell array, a plurality of control circuits operatively coupled to the array, and a voltage regulation system. The system includes an array power bus operatively coupled to the array for distributing an array supply voltage to the array, and a control circuit power bus operatively coupled to the plurality of control circuits for distributing a control circuit supply voltage to the plurality of control circuits. The system also includes a first regulator circuit operatively coupled to, for example, the array power bus at a first location along the array power bus for providing and regulating the array supply voltage. The system further includes a second regulator circuit operatively coupled to, for example, the control circuit power bus at a first location along the control circuit power bus for providing and regulating the control circuit supply voltage. Finally, the system includes a third regulator circuit operatively coupled to, for example, the control circuit power bus at a second location spaced apart from the first along the control circuit power bus for providing and regulating the control circuit supply voltage. The second location is far enough from the first location along the control circuit power bus to allow the third regulator circuit to respond to a localized variation in the control circuit supply voltage at the second location.

Preferably, the regulator circuits are constructed such that they can be turned on and off in response to control signals received from the control circuits. Also, the control circuits are preferably operatively coupled to the first, second and third regulator circuits for providing the control signals in a variety of operating modes of the memory device. The control signals turn on only the regulator circuits required for each operating mode during active cycles of the memory device and turn the regulator circuits off during stand-by cycles of the memory device.

The present invention thus provides a memory device with a voltage regulation system which provides responsive regulation of, for example, the control circuit supply voltage along the entire length of the control circuit power bus. The system also reduces the effect noise from the memory cell array has on operation of the array's control circuits by providing separate array and control circuit power busses. Finally, the system is more efficient with power because only the regulator circuits required for each operating mode of the memory device are turned on during active cycles of the memory device.

DETAILED DESCRIPTION OF THE INVENTION

Figure 1:
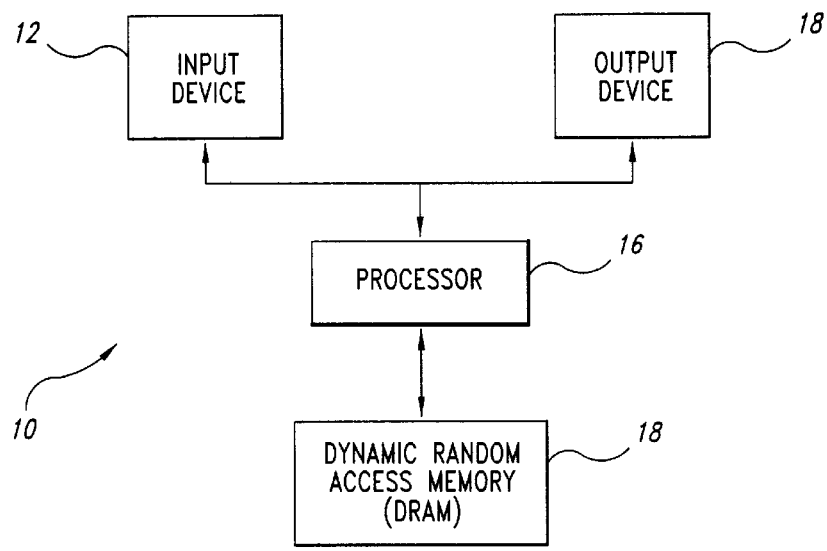
FIG. 1 is a block diagram of a preferred computer system according to the present invention.

As shown in FIG. 1, a preferred embodiment of the present invention comprises a computer system 10 including an input device 12, such as a keyboard, and an output device 14, such as a computer monitor, both operatively coupled to a processor 16. The preferred computer system 10 also includes a memory device such as a dynamic random access memory (DRAM) 18 operatively coupled to the processor 16. Although the present invention will be described with respect to a DRAM, those having skill in the field of this invention will understand that the present invention is applicable to any memory device which internally regulates a supply voltage.

Figure 2:
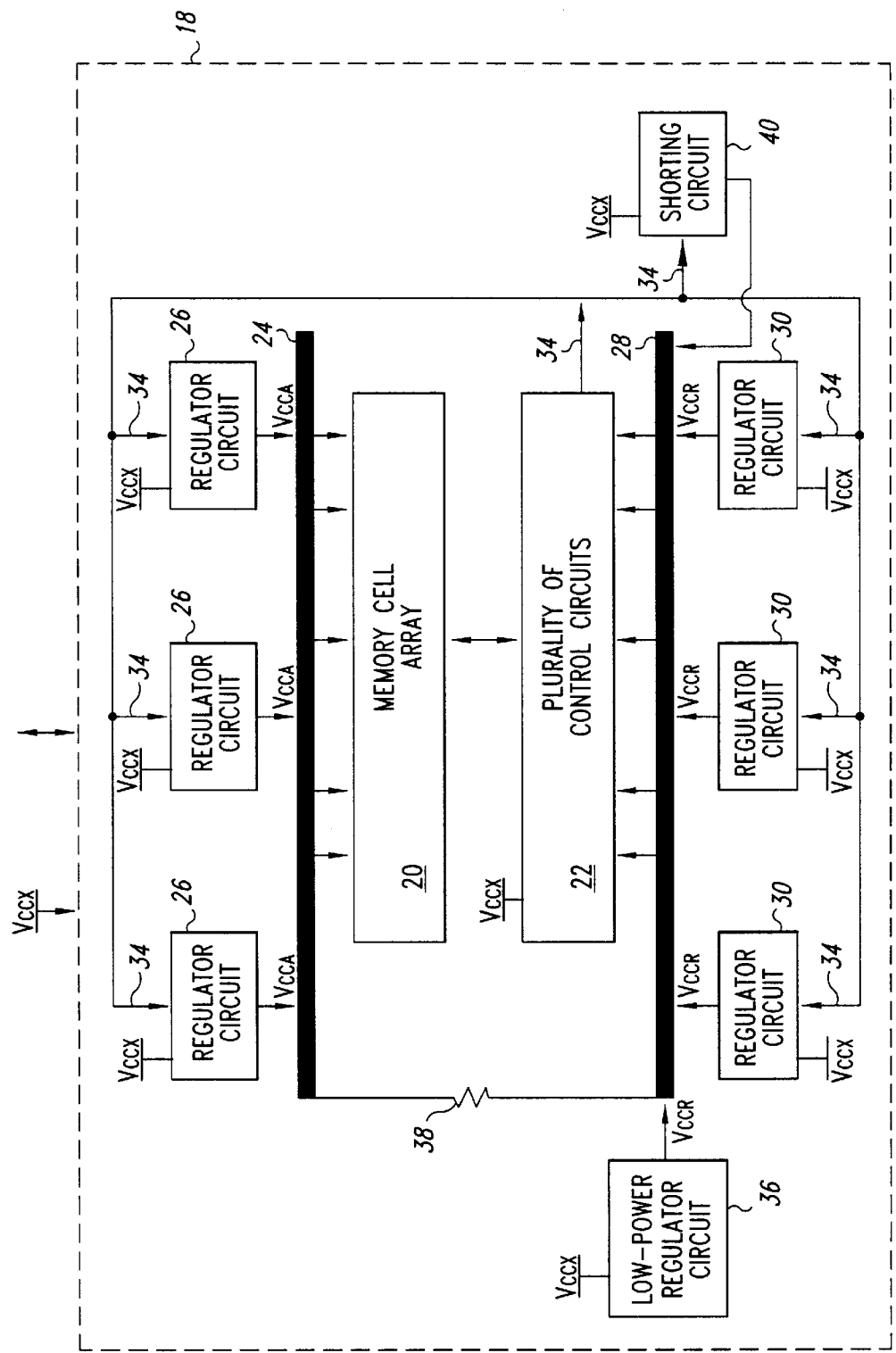
FIG. 2 is a block diagram of a preferred dynamic random access memory used in the computer system of FIG. 1.

The DRAM 18 of FIG. 1 is shown in more detail in FIG. 2. The DRAM 18 includes a memory cell array 20 operatively coupled to a plurality of control circuits 22. The control circuits 22 are preferably constructed to provide control signals 34, as will be described in more detail below.

The DRAM 18 also includes a voltage regulation system having an array power bus 24 operatively coupled to the array 20 to provide an array supply voltage $V_{CCA}$ to the array 20. A first plurality of regulator circuits 26 are each operatively coupled to the array power bus 24 to provide and regulate the array supply voltage $V_{CCA}$. Also, a control circuit power bus 28 is operatively coupled to the control circuits 22 to provide a control circuit supply voltage $V_{CCR}$ to the control circuits 22. A second plurality of regulator circuits 30 are each operatively coupled to the control circuit power bus 28 to provide and regulate the control circuit supply voltage $V_{CCR}$.

The regulator circuits 26 and 30 are coupled to the array and control circuit power busses 24 and 28, respectively, at spaced-apart locations which advantageously allow them each to respond quickly to a localized variation in the array and control circuit supply voltages $V_{CCA}$ and $V_{CCR}$, respectively. Also, it will be understood that, by separating the array and control circuit power busses 24 and 28, the present invention advantageously isolates the control circuits 22 from noise in the array supply voltage $V_{CCA}$ caused by the memory cell array 20 at the beginning of active cycles of the DRAM 18.

Each of the regulator circuits 26 and 30 is also preferably operatively coupled to the control circuits 22 to receive control signals 34 from the control circuits 22. Each of the regulator circuits 26 and 30 is constructed such that it will turn on in a high or normal power mode, or turn off, in response to receiving the control signals 34. The regulator circuits 26 and 30 will be described in more detail below with respect to FIG. 4.

The control signals 34 manage the operation of the regulator circuits 26 and 30 during both active and stand-by cycles of the DRAM 18 in a variety of operating modes of the DRAM 18. In some of these operating modes requiring all of the regulator circuits 26 and 30, the control signals 34 turn all the regulator circuits 26 and 30 on during active cycles, and turn them all off during stand-by cycles. An example of such an operating mode is one in which all of the array 20 can be accessed in active cycles of the DRAM 18. In other operating modes requiring fewer than all of the regulator circuits 26 and 30, the control signals 34 turn only some of the regulator circuits 26 and 30 on during active cycles, and turn all of them off during stand-by cycles. An example of such an operating mode is one in which only some of the array 20 can be accessed in active cycles of the DRAM 18. The control signals 34 thus advantageously manage the operating state, and hence the power consumption, of the regulator circuits 26 and 30 in a more efficient manner than conventional internal voltage regulators.

The voltage regulation system further includes a low-power regulator circuit 36 operatively coupled to the control circuit power bus 28 to provide and regulate the control circuit supply voltage $V_{CCR}$. The low-power regulator circuit 36 stays on during stand-by cycles of the DRAM 18 to maintain the control circuit supply voltage $V_{CCR}$ while the regulator circuits 30 are off. A resistor 38 couples the control circuit power bus 28 to the array power bus 24 and allows the low-power regulator circuit 36 to also maintain the array supply voltage $V_{CCA}$ while the regulator circuits 26 are off during stand-by cycles of the DRAM 18. The low-power regulator circuit 36 will be described in more detail below with respect to FIG. 5.

The voltage regulation system still further includes a shorting circuit 40 operatively coupled to the control circuit power bus 28 and to the control circuits 22 to receive a control signal 34 from the control circuits 22 at the beginning of an active cycle of the DRAM 18. The shorting circuit 40 responds to the control signal 34 by coupling the control circuit power bus 28 to an external supply voltage $V_{CCX}$ for a period of time long enough to allow the regulator circuits 30 to turn on and begin regulating the control circuit supply voltage $V_{CCR}$. Of course, the shorting circuit 40 could be operatively coupled to the array power bus 24 instead.

Figure 3:
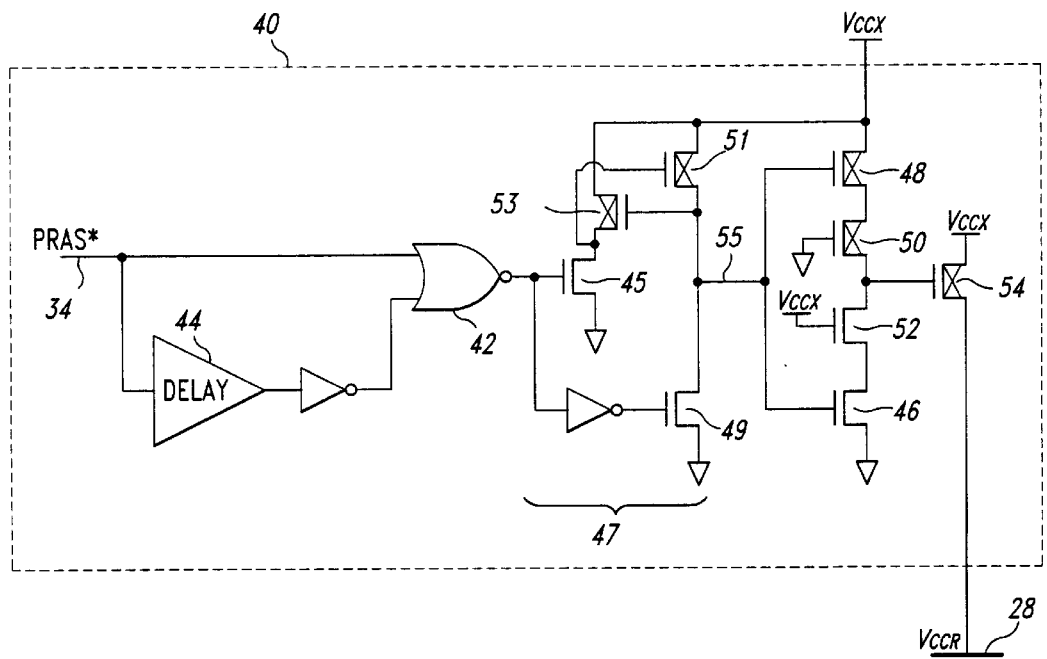
FIG. 3 is a schematic of a preferred shorting circuit used in the random access memory of FIG. 2.

A preferred embodiment of the shorting circuit 40 of FIG. 2 is shown in more detail in FIG. 3. The shorting circuit 40 receives a control signal 34, such as PRAS*, which goes low at the beginning of an active cycle of the DRAM 18 (FIG. 2). When PRAS* goes low, both inputs to a NOR gate 42 are low for a period of time equal to the delay of a delay element 44. As a result, the output of the NOR gate 42 is high for this same period of time. While the output of the NOR gate 42 is high, an NMOS transistor 45 of a level shifter 47 turns on and an NMOS transistor 49 of the level shifter 47 turns off. While the NMOS transistor 45 is on, the gate of a PMOS transistor 51 is low, which turns the PMOS transistor 51 on. At the same time, a PMOS transistor 53 turns off because the NMOS transistor 49 is off. As a result, an output 55 of the level shifter 47 is high when the output of the NOR gate 42 is high, and the output 55 of the level shifter 47 is provided at the proper voltage level ($V_{CCX}$) to drive a PMOS transistor 48 and an NMOS transistor 46. While the output 55 of the level shifter 47 is high, the NMOS transistor 46 turns on and the PMOS transistor 48 turns off. A second PMOS transistor 50 and a second NMOS transistor 52 are always biased on so that they act as resistors. When the PMOS transistor 48 turns off and the NMOS transistor 46 turns on, the input to another PMOS transistor 54 goes low and hence turns the PMOS transistor 54 on. As a result, the external supply voltage $V_{CCX}$ is shorted to the control circuit power bus 28 for the period of time equal to the delay of the delay element 44. In the preferred embodiment this period of time is approximately 9 nS, and it allows the external supply voltage $V_{CCX}$ to maintain the control circuit supply voltage $V_{CCR}$ while the regulators 30 (FIG. 2) are turning on.

After the delay time, the output of the NOR gate 42 goes low, thereby turning off the NMOS transistor 45 and turning on the NMOS transistor 49. While the NMOS transistor 45 is off, the input to the NMOS transistor 51 goes high and the PMOS transistor 51 turns off. Also, while the NMOS transistor 49 is on, the input to the PMOS transistor 53 goes low and the PMOS transistor 53 turns on. As a result, the output of the level shifter 47 goes low, thereby turning on the PMOS transistor 48 and turning off the NMOS transistor 46. The gate of the PMOS transistor 54 is then driven high, thereby turning off the PMOS transistor 54. The PMOS transistor 54 then isolates the control circuit power bus 28 from $V_{CCX}$.

Figure 4:
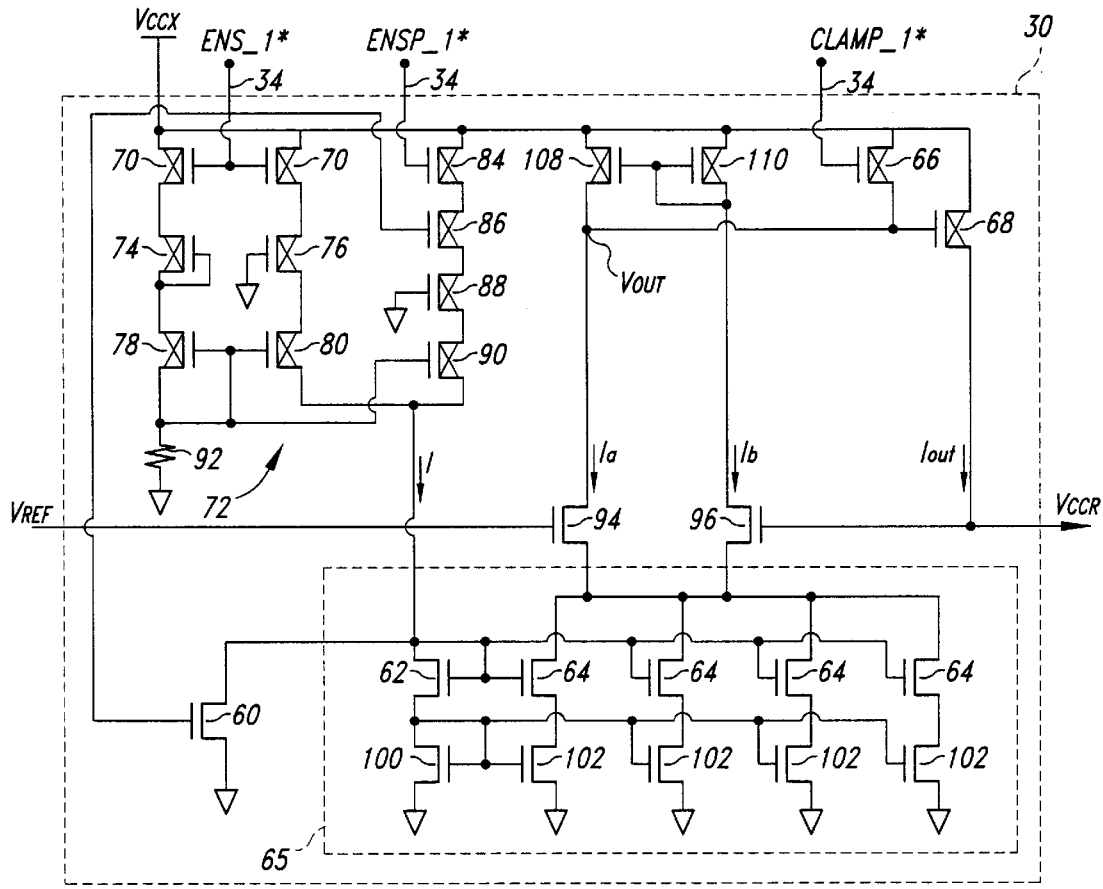
FIG. 4 is a schematic of a preferred regulator circuit used in the random access memory of FIG. 2.

A preferred embodiment of regulator circuits 26 and 30 providing the control circuit supply voltage $V_{CCR}$ is shown in more detail in FIG. 4. The regulator circuit 30 receives control signals 34 such as ENS_1*, ENSP_1* and CLAMP_1*, although it will of course be understood that other regulator circuits 26 and 30 may receive other control signals. ENS_1* turns the regulator circuit 30 on in a normal power mode, ENSP_1* turns the regulator circuit 30 on in a high power mode, and CLAMP_1* turns the regulator circuit 30 off.

During stand-by cycles of the DRAM 18 (FIG. 2), ENS_1* and ENSP_1* are typically high, and CLAMP_1* is typically low. The high ENS_1* turns an NMOS transistor 60 on. The NMOS transistor 60 then grounds the gates of NMOS transistors 62, 64 of a current mirror 65. This effectively turns the current mirror 65 off. At the same time, the low CLAMP_1* turns a PMOS transistor 66 on which, in turn, turns an output PMOS transistor 68 off. The PMOS transistor 68 supplies current $I_{OUT}$ to the control circuit power bus 28.

During active cycles, ENS_1* typically goes low and CLAMP_1* typically goes high. ENSP_1* can optionally go low if the high power mode is needed. When ENS_1* goes low, PMOS transistors 70 turn on and a current source 72 formed by biasing PMOS transistors 74, 76, 78, 80 provides a bias current I in the normal power mode. If ENSP_1* also goes low, PMOS transistor 84 turns on and begins providing a larger bias current I in the high power mode through PMOS transistor 86 (which was turned on by the low ENS_1*) and PMOS transistors 88, 90 which are biased on through resistor 92 so that they function as resistors. The bias current I flows through the NMOS transistor 62 and a second NMOS transistor 100, thereby causing a voltage to be generated at the drain of the NMOS transistor 62. The magnitude of this voltage is a function of the magnitude of the bias current I. The voltage on the drain of the NMOS transistor 62 is applied to the gate of the NMOS transistor 62 as well as to the gates of the NMOS transistors 64 of the current mirror 65. The NMOS transistors 64 are operated in their pinch-off region so that their drain-source currents are essentially a function of only their gate-source voltages which are, in turn, a function of the bias current I. Thus, the drain-source current of each NMOS transistor 64 and a respective NMOS series transistor 102 is a function of the bias current I. It is also, of course, a function of the W/L ratios of the NMOS transistors 62, 64, 100 and 102. The sum of currents $I_a$ and $I_b$ through NMOS transistors 94 and 96 is therefore proportional to the bias current I.

The gate of the NMOS transistor 94 receives a reference voltage $V_{REF}$, and the gate of the NMOS transistor 96 receives the control circuit supply voltage $V_{CCR}$. The NMOS transistors 94, 96 are operated linearly as differential transistors so that the sum of the currents $I_a$ and $I_b$ is always constant (for a constant bias current I). The currents $I_a$, $I_b$ are supplied through respective PMOS transistors 108, 110 which are biased to function as resistors. If the control circuit supply voltage $V_{CCR}$ drops relative to the reference voltage $V_{REF}$, then an output voltage $V_{OUT}$ of the differential NMOS transistor 94 drops, thereby increasing the output current $I_{OUT}$ through the output PMOS transistor 68. An increase in the output current $I_{OUT}$ causes an increase in the circuit supply voltage $V_{CCR}$. As the control circuit supply voltage $V_{CCR}$ rises relative to the reference voltage $V_{REF}$, the output voltage $V_{OUT}$ rises and decreases the output current $I_{OUT}$ through the output PMOS transistor 68. The regulator circuit is designed so that the circuit supply voltage $V_{CCR}$ is maintained at the reference voltage $V_{REF}$.

In operation, the regulator circuit 30 regulates $V_{CCR}$ so that $V_{CCR}$ is substantially equal to $V_{REF}$ whenever ENS_1* is low and CLAMP_1* is high. However, the amount of current $I_{OUT}$ that the regulator circuit 30 can deliver can be increased by also driving ENSP_1* low. Whenever CLAMP_1* is low, the gate of the output PMOS transistor 68 is biased high, thereby turning off the output PMOS transistor 68 and preventing the regulator circuit 30 from delivering any output current.

It will be understood that a variety of design modifications can be made to the regulator circuit 30. For example, the W/L ratios of the PMOS transistors of the current source 72 can be modified to increase the bias current I. Since the slew rate of the regulator circuit 30 is approximately proportional to the bias current I, increasing the bias current I will advantageously increase the slew rate of the regulator circuit 30. Also, increasing the W/L ratio of the output PMOS transistor 68 will increase the potential output current $I_{OUT}$.

Figure 5:
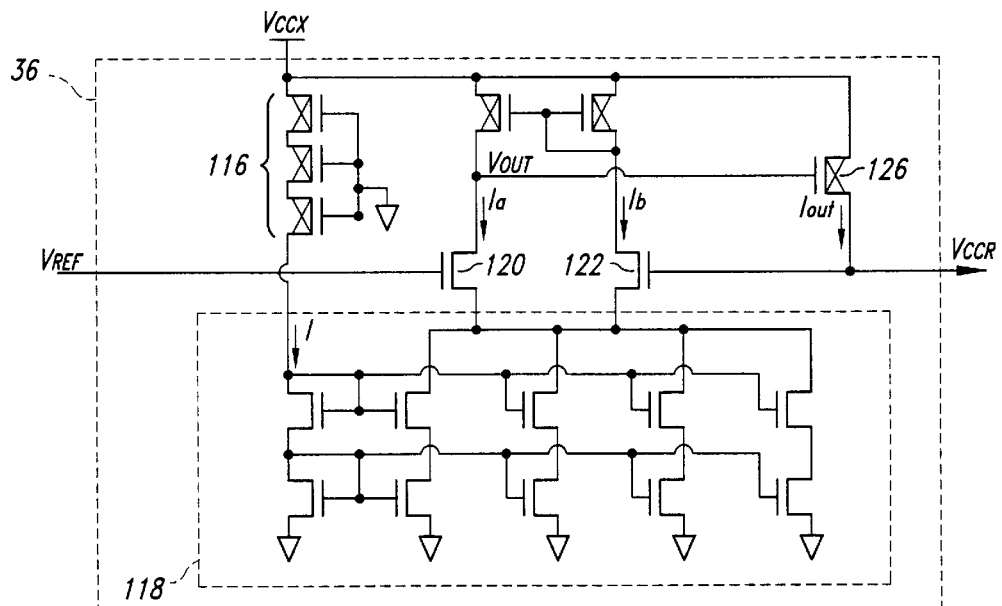
FIG. 5 is a diagram of a preferred low-power regulator circuit used in the random access memory of FIG. 2.

The preferred low-power regulator circuit 36 is shown in more detail in FIG. 5. The regulator circuit 36 is similar in topography and operation to the regulator circuit 30 of FIG. 4 and is thus not explained in detail. Basically, a current source 116 provides a bias current I which is mirrored in a current mirror 118. The current mirror 118 in turn draws bias currents $I_a$ and $I_b$ through a differential pair of NMOS transistors 120 and 122, respectively. The sum of the bias currents $I_a$ and $I_b$ is proportional to the bias current I.

The gate of the differential NMOS transistor 120 receives a reference voltage $V_{REF}$, and the gate of the differential NMOS transistor 122 receives the control circuit supply voltage $V_{CCR}$. If the control circuit supply voltage $V_{CCR}$ drops relative to the reference voltage $V_{REF}$, then an output voltage $V_{OUT}$ of the differential NMOS transistor 120 drops. The drop in $V_{OUT}$ increases the output current $I_{OUT}$ through an output PMOS transistor 126 and thereby raises the control circuit supply voltage $V_{CCR}$. As the control circuit supply voltage $V_{CCR}$ rises relative to the reference voltage $V_{REF}$, the output voltage $V_{OUT}$ rises and decreases the output current $I_{OUT}$ through the output PMOS transistor 126, thereby causing the control circuit supply voltage $V_{CCR}$ to settle back toward the reference voltage $V_{REF}$.

It will be understood that a variety of design modifications can be made to the low-power regulator circuit 36. For example, the W/L ratio of the PMOS transistors of the current source 116 can be modified to decrease the bias current I and thereby decrease the power consumption of the regulator circuit 36. Also, the W/L ratio of the output PMOS transistor 126 can be decreased to decrease the potential output current $I_{OUT}$ and thereby decrease the power consumption of the regulator circuit 36.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. A memory device comprising:
   a memory cell array;
   a control circuit operatively coupled to the memory cell array; and
   a voltage regulation system comprising:
      an array power bus operatively coupled to the memory cell array for distributing an array supply voltage to the memory cell array;
      a control circuit power bus operatively coupled to the control circuit for distributing a control circuit supply voltage to the control circuit;
      a first regulator circuit operatively coupled to the array power bus at a first location along the array power bus for regulating and providing the regulated array supply voltage; and
      a second regulator circuit operatively coupled to the control circuit power bus at a first location along the control circuit power bus for regulating and providing the regulated control circuit supply voltage.

2. The memory device of claim 1 wherein the voltage regulation system further comprises a third regulator circuit operatively coupled to either the array power bus or the control circuit power bus at a second location spaced apart from the first location for providing a second regulated array or control circuit supply voltage, respectively.

3. The memory device of claim 1 wherein the memory device comprises a dynamic random access memory.

4. The memory device of claim 1 wherein each of the regulator circuit comprises:
   a differential amplifier circuit having a first input terminal operatively coupled to the respective array or control circuit power bus of the regulator circuit for receiving the respective array or control circuit supply voltage of the regulator circuit, a second input terminal receiving a reference voltage, and an output terminal providing a differential control signal; and a switching device having an input terminal receiving an external supply voltage, an output teminal operatively coupled to the respective array or control circuit power bus of the regulator circuit for providing the respective array or control circuit supply voltage of the regulator circuit, and a control terminal operatively coupled to the output terminal of the differential amplifier for receiving the differential control signal, the differential control signal causing the switching device to increasingly and decreasingly provide an output current to its output terminal when the respective array or control circuit supply voltage of the regulator circuit decreases and increases, respectively.

5. The memory device of claim 4 wherein each differential amplifier is constructed such that it can operate in both a normal power mode and a high power mode.

6. The memory device of claim 1 wherein the first and second regulator circuits are constructed such that they can be turned off during stand-by cycles of the memory device, wherein the voltage regulation system further comprises:

a low-power regulator circuit operatively coupled to one of the array and control circuit power busses for providing a regulated array or control circuit supply voltage, respectively, during stand-by cycles of the memory device while the first and second regulator circuits are off; and a resistive device coupling the array and control circuit power busses so that the low-power regulator circuit can regulate both the array supply voltage and the control circuit supply voltage during stand-by cycles of the memory device.

7. The memory device of claim 6 wherein the low-power regulator circuit comprises:

a differential amplifier circuit having a first input terminal operatively coupled to the respective array or control circuit power bus of the low-power regulator circuit for receiving the respective array or control circuit supply voltage of the low-power regulator circuit, a second input terminal receiving a reference voltage, and an output terminal providing a differential control signal; and a switching device having an input terminal receiving an external supply voltage, an output terminal operatively coupled to the respective array or control circuit power bus of the low-power regulator circuit for providing the respective array or control circuit supply voltage of the low-power regulator circuit, and a control terminal operatively coupled to the output terminal of the differential amplifier for receiving the differential control signal, the differential control signal causing the switching device to increasingly and decreasingly provide an output current to its output terminal when the respective array or control circuit supply voltage of the regulator circuit decreases and increases, respectively.

8. The memory device of claim 1 wherein the voltage regulation system further comprises a shorting circuit for operatively coupling at least one of the array and control circuit power busses to an external supply voltage for a period of time at the beginning of active cycles of the memory device.

9. The memory device of claim 1 wherein the first and second regulator circuits each comprises a plurality of voltage regulators which are separately connected to the array power bus and the control circuit power bus, respectively, at respective spaced apart locations along the array power bus and the control circuit power bus, respectively.

10. A memory device comprising:

a memory cell array; and a voltage regulation system comprising:

an array power bus operatively coupled to the memory cell array for distributing an array supply voltage to the memory cell array; and a regulator circuit operatively coupled to the array power bus at a plurality of respective spaced apart locations along the array power bus for regulating and providing the array supply voltage to the array power bus at respective spaced apart locations, the regulator circuit comprising:

a differential amplifier circuit having a first input terminal operatively coupled to the array power bus of the regulator circuit for receiving the array supply voltage of the regulator circuit, a second input terminal receiving a reference voltage, and an output terminal providing a differential control signal; and a switching device having an input terminal receiving an external supply voltage, an output terminal operatively coupled to the array power bus of the regulator circuit for providing the array supply voltage of the regulator circuit, and a control terminal operatively coupled to the output terminal of the differential amplifier for receiving the differential control signal, the differential control signal causing the switching device to increasingly and decreasingly provide an output current to its output terminal when the array supply voltage of the regulator circuit decreases and increases, respectively.

11. A memory device comprising:

a memory cell array; and a voltage regulation system comprising:

an array power bus operatively coupled to the memory cell array for distributing an array voltage to the memory cell array; and a regulator circuit operatively coupled to the array power bus at a plurality of respective spaced apart locations along the array power bus for regulating and providing the array supply voltage to the array power bus at respective spaced apart locations, the regulator circuit being constructed such that it can be turned off during stand-by cycles of the memory device, wherein the voltage regulation system further comprises a low-power regulator circuit operatively coupled to the array power bus for providing a regulated array supply voltage during stand-by cycles of the memory device while the other regulator circuit is off.

12. A memory device comprising:

a memory cell array; and a voltage regulation system comprising:

an array power bus operatively coupled to the memory cell array for distributing an array voltage to the memory cell array;

a regulator circuit operatively coupled to the array power bus at a plurality of respective spaced apart locations along the array power bus for regulating and providing the array supply voltage to the array power bus at respective spaced apart locations; and a shorting circuit for operatively coupling the array power bus to an external supply voltage for a period of time at the beginning of active cycles of the memory device.

13. A memory device comprising:
a memory cell array;
a control circuit operatively coupled to the memory cell array; and
a voltage regulation system comprising:
a control circuit power bus operatively coupled to the control circuit for distributing a control circuit supply voltage to the control circuit; and
a regulator circuit operatively coupled to the control circuit power bus at a plurality of respective spaced apart locations along the control circuit power bus for regulating and providing the control circuit supply voltage to the control circuit power bus at respective spaced apart locations.

14. The memory device of claim 13 wherein the regulator circuit comprises a plurality of voltage regulators which are separately connected to the control circuit power bus at respective spaced apart locations along the control circuit power bus.

15. The memory device of claim 13 wherein the memory device comprises a dynamic random access memory.

16. The memory device of claim 13 wherein the regulator circuit comprises:
a differential amplifier circuit having a first input terminal operatively coupled to the control circuit power bus of the regulator circuit for receiving the control circuit supply voltage of the regulator circuit, a second input terminal receiving a reference voltage, and an output terminal providing a differential control signal; and
a switching device having an input terminal receiving an external supply voltage, an output terminal operatively coupled to the control circuit power bus of the regulator circuit for providing the control circuit supply voltage of the regulator circuit, and a control terminal operatively coupled to the output terminal of the differential amplifier for receiving the differential control signal, the differential control signal causing the switching device to increasingly and decreasingly provide an output current to its output terminal when the control circuit supply voltage of the regulator circuit decreases and increases, respectively.

17. The memory device of claim 13 wherein the regulator circuit is constructed such that it can be turned off during stand-by cycles of the memory device, wherein the voltage regulation system further comprises a low-power regulator circuit operatively coupled to the control circuit power bus for providing a regulated control circuit supply voltage during stand-by cycles of the memory device while the other regulator circuit is off.

18. The memory device of claim 13 wherein the voltage regulation system further comprises a shorting circuit for operatively coupling the control circuit power bus to an external supply voltage for a period of time at the beginning of active cycles of the memory device.

19. A computer system comprising:
an input device;
an output device;
a processor operatively coupled to the input and output devices; and
a memory device operatively coupled to the processor, the memory device comprising:
a memory cell array;
a control circuit operatively coupled to the memory cell array; and
a voltage regulation system comprising:
an array power bus operatively coupled to the memory cell array for distributing an array supply voltage to the memory cell array;
a control circuit power bus operatively coupled to the control circuit for distributing a control circuit supply voltage to the control circuit;
a first regulator circuit operatively coupled to the array power bus at a first location along the array power bus for regulating and providing the regulated array supply voltage; and
a second regulator circuit operatively coupled to the control circuit power bus at a first location along the control circuit power bus for regulating and providing the regulated control circuit supply voltage.

20. The computer of claim 19 wherein the voltage regulation system further comprises a third regulator circuit operatively coupled to either the array power bus or the control circuit power bus at a second location spaced apart from the first location for providing a second regulated array or control circuit supply voltage, respectively.

21. The computer system of claim 19 wherein the memory device comprises a dynamic random access memory.

22. The computer system of claim 19 wherein each of the regulator circuit comprises:
a differential amplifier circuit having a first input terminal operatively coupled to the respective array or control circuit power bus of the regulator circuit for receiving the respective array or control circuit supply voltage of the regulator circuit, a second input terminal receiving a reference voltage, and an output terminal providing a differential control signal; and
a switching, device having an input terminal receiving an external supply voltage, an output terminal operatively coupled to the respective array or control circuit power bus of the regulator circuit for providing the respective array or control circuit supply voltage of the regulator circuit, and a control terminal operatively coupled to the output terminal of the differential amplifier for receiving the differential control signal, the differential control signal causing the switching device to increasingly and decreasingly provide an output current to its output terminal when the respective array or control circuit supply voltage of the regulator circuit decreases and increases, respectively.

23. The computer system of claim 22 wherein each differential amplifier is constructed such that it can operate in both a normal power mode and a high power mode.

24. The computer system of claim 19 wherein the first and second regulator circuits are constructed such that they can be turned off during stand-by cycles of the memory device, wherein the voltage regulation system further comprises:
a low-power regulator circuit operatively coupled to one of the array and control circuit power busses for providing a regulated array or control circuit supply voltage, respectively, during stand-by cycles of the memory device while the first and second regulator circuits are off; and
a resistive device coupling the array and control circuit power busses so that the low-power regulator circuit can regulate both the array supply voltage and the control circuit supply voltage during stand-by cycles of the memory device.

25. The computer system of claim 24 wherein the low-power regulator circuit comprises:
a differential amplifier circuit having a first input terminal operatively coupled to the respective array or control circuit power bus of the low-power regulator circuit for receiving the respective array or control circuit supply voltage of the low-power regulator circuit, a second input terminal receiving a reference voltage, and an output terminal providing a differential control signal; and a switching device having an input terminal receiving an external supply voltage, an output terminal operatively coupled to the respective array or control circuit power bus of the low-power regulator circuit for providing the respective array or control circuit supply voltage of the low-power regulator circuit, and a control terminal operatively coupled to the output terminal of the differential amplifier for receiving the differential control signal, the differential control signal causing the switching device to increasingly and decreasingly provide an output current to its output terminal when the respective array or control circuit supply voltage of the regulator circuit decreases and increases, respectively.

26. The computer system of claim 19 wherein the voltage regulation system further comprises a shorting circuit for operatively coupling at least one of the array and control circuit power busses to an external supply voltage for a period of time at the beginning of active cycles of the memory device.

27. The computer system of claim 19 wherein the first and second regulator circuits each comprises a plurality of voltage regulators which are separately connected to the array power bus and the control circuit power bus, respectively, at respective spaced apart locations along the array power bus and the control circuit power bus, respectively.

28. A computer system comprising:
an input device;
an output device;
a processor operatively coupled to the input and output devices; and
a memory device operatively coupled to the processor, the memory device comprising:
 a memory cell array; and
 a voltage regulation system comprising;
  an array power bus operatively coupled to the memory cell array for distributing an array supply voltage to the memory cell array; and
  a regulator circuit operatively coupled to the array power bus at a plurality of respective spaced apart locations along the array power bus for regulating and providing the array supply voltage to the array power bus at respective spaced apart locations, the regulator circuit comprising:
   a differential amplifier circuit having a first input terminal operatively coupled to the array power bus of the regulator circuit for receiving the array supply voltage of the regulator circuit, a second input terminal receiving a reference voltage, and an output terminal providing a differential control signal; and
   a switching device having an input terminal receiving an external supply voltage, an output terminal operatively coupled to the array power bus of the regulator circuit for providing the array supply voltage of the regulator circuit, and a control terminal operatively coupled to the output terminal of the differential amplifier for receiving the differential control signal, the differential control signal causing the switching device to increasingly and decreasingly provide an output current to its output terminal when the array supply voltage of the regulator circuit decreases and increases, respectively.

29. A computer system comprising:
an input device;
an output device;
a processor operatively coupled to the input and output devices; and
a memory device operatively coupled to the processor, the memory device comprising:
 a memory cell array; and
 a voltage regulation system comprising;
  an array power bus operatively coupled to the memory cell array for distributing an array supply voltage to the memory cell array; and
  a regulator circuit operatively coupled to the array power bus at a plurality of respective spaced apart locations along the array power bus for regulating and providing the array supply voltage to the array power bus at respective spaced apart locations, the regulator circuit being constructed such that it can be turned off during stand-by cycles of the memory device, wherein the voltage regulation system further compromises a low-power regulator circuit operatively coupled to the array power bus for providing a regulated array supply voltage during stand-by cycles of the memory device while the other regulator circuit is off.

30. A computer system comprising:
an input device;
an output device,
a processor operatively coupled to the input and output devices; and
a memory device operatively coupled to the processor, the memory device comprising:
 a memory cell array; and
 a voltage regulation system comprising;
  an array power bus operatively coupled to the memory cell array for distributing an array supply voltage to the memory cell array; and
  a regulator circuit operatively coupled to the array power bus at a plurality of respective spaced apart locations along the array power bus for regulating and providing the array supply voltage to the array power bus at respective spaced apart locations; and a shorting circuit for operatively coupling the array power bus to an external supply voltage for a period of time at the beginning of active cycles of the memory device.

31. A computer system comprising:
an input device;
an output device;
a processor operatively coupled to the input and output devices; and
a memory device operatively coupled to the processor, the memory device comprising:
 a memory cell array;
 a control circuit operatively coupled to the memory cell array; and
 a voltage regulation system comprising:
  a control circuit power bus operatively coupled to the control circuit for distributing a control circuit supply voltage to the control circuit; and a regulator circuit operatively coupled to the control circuit power bus at a plurality of respective spaced apart locations along the control circuit power bus for regulating and providing the control circuit supply voltage to the control circuit power bus at respective spaced apart locations.

32. The computer system of claim 31 wherein the regulator circuit comprises a plurality of voltage regulators which are separately connected to the control circuit power bus at respective spaced apart locations along the control circuit power bus.

33. The computer system of claim 31 wherein the memory device comprises a dynamic random access memory.

34. The computer system of claim 31 wherein the regulator circuit comprises:

a differential amplifier circuit having a first input terminal operatively coupled to the control circuit power bus of the regulator circuit for receiving the control circuit supply voltage of the regulator circuit, a second input terminal receiving a reference voltage, and an output terminal providing a differential control signal; and a switching device having an input terminal receiving an external supply voltage, an output terminal operatively coupled to the control circuit power bus of the regulator circuit for providing the control circuit supply voltage of the regulator circuit, and a control terminal operatively coupled to the output terminal of the differential amplifier for receiving the differential control signal, the differential control signal causing the switching device to increasingly and decreasingly provide an output current to its output terminal when the control circuit supply voltage of the regulator circuit decreases and increases, respectively.

35. The computer system of claim 31 wherein the regulator circuit is constructed such that it can be turned off during stand-by cycles of the memory device, wherein the voltage regulation system further comprises a low-power regulator circuit operatively coupled to the control circuit power bus for providing a regulated control circuit supply voltage during stand-by cycles of the memory device while the other regulator circuit is off.

36. The computer system of claim 31 wherein the voltage regulation system further comprises a shorting circuit for operatively coupling the control circuit power bus to an external supply voltage for a period of time at the beginning of active cycles of the memory device.

37. A voltage regulation system for a memory device having a memory cell array and a control circuit, the voltage regulation system comprising:

an array power bus operatively coupled to the memory cell array for distributing an array supply voltage to the memory cell array;

a control circuit power bus operatively coupled to the control circuit for distributing a control circuit supply voltage to the control circuit;

a first regulator circuit operatively coupled to the array power bus at a first location along the array power bus for regulating and providing the regulated array supply voltage; and a second regulator circuit operatively coupled to the control circuit power bus at a first location along the control circuit power bus for regulating and providing the regulated control circuit supply voltage.

38. The voltage regulation system of claim 37 further comprising a third regulator circuit operatively coupled to either the array power bus or the control circuit power bus at a second location spaced apart from the first location for providing a second regulated array or control circuit supply voltage, respectively.

39. The voltage regulation system of claim 37 wherein each of the regulator circuits comprises:

a differential amplifier circuit having a first input terminal operatively coupled to the respective array or control circuit power bus of the regulator circuit for receiving the respective array or control circuit supply voltage of the regulator circuit, a second input terminal receiving a reference voltage, and an output terminal providing a differential control signal; and a switching device having an input terminal receiving an external supply voltage, an output terminal operatively coupled to the respective array or control circuit power bus of the regulator circuit for providing the respective array or control circuit supply voltage of the regulator circuit, and a control terminal operatively coupled to the output terminal of the differential amplifier for receiving the differential control signal, the differential control signal causing the switching device to increasingly and decreasingly provide an output current to its output terminal when the respective array or control circuit supply voltage of the regulator circuit decreases and increases, respectively.

40. The voltage regulation system of claim 39 wherein each differential amplifier is constructed such that it can operate in both a normal power mode and a high power mode.

41. The voltage regulation system of claim 39 wherein the first and second regulator circuits are constructed such that they can be turned off during stand-by cycles of the memory device, wherein the voltage regulation system further comprises:

a low-power regulator circuit operatively coupled to one of the array and control circuit power busses for providing a regulated array or control circuit supply voltage, respectively, during stand-by cycles of the memory device while the first and second regulator circuits are off; and a resistive device coupling the array and control circuit power busses so that the low-power regulator circuit can regulate both the array supply voltage and the control circuit supply voltage during stand-by cycles of the memory device.

42. The voltage regulation system of claim 41 wherein the low-power regulator circuit comprises:

a differential amplifier circuit having a first input terminal operatively coupled to the respective array or control circuit power bus of the low-power regulator circuit for receiving the respective array or control circuit supply voltage of the low-power regulator circuit, a second input terminal receiving a reference voltage, and an output terminal providing a differential control signal; and a switching device having an input terminal receiving an external supply voltage, an output terminal operatively coupled to the respective array or control circuit power bus of the low-power regulator circuit for providing the respective array or control circuit supply voltage of the low-power regulator circuit, and a control terminal operatively coupled to the output terminal of the differential amplifier for receiving the differential control signal, the differential control signal causing the switching device to increasingly and decreasingly provide an output current to its output terminal when the respective array or control circuit supply voltage of the regulator circuit decreases and increases, respectively.

43. The voltage regulation system of claim 39 further comprising a shorting circuit for operatively coupling at least one of the array and control circuit power busses to an external supply voltage for a period of time at the beginning of active cycles of the memory device.

44. The voltage regulation system of claim 39 wherein the first and second regulator circuits each comprises a plurality of voltage regulators which are separately connected to the array power bus and the control circuit power bus, respectively, at respective spaced apart locations along the array power bus and the control circuit power bus, respectively.

45. A voltage regulation system for a memory device having a memory cell array and a control circuit, the voltage regulation system comprising:

an array power bus operatively coupled to the memory cell array for distributing an array supply voltage to the memory cell array; and a regulator circuit operatively coupled to the array power bus at a plurality of respective spaced apart locations along the array power bus for regulating and providing the array supply voltage to the array power bus at respective spaced apart locations.

46. The voltage regulation system of claim 45 wherein the regulator circuit comprises a plurality of voltage regulators which are separately connected to the array power bus at a respective spaced apart locations along the array power bus.

47. The voltage regulation system of claim 45 wherein the regulator circuit comprises:

a differential amplifier circuit having a first input terminal operatively coupled to the array power bus of the regulator circuit for receiving the array supply voltage of the regulator circuit, a second input terminal receiving a reference voltage, and an output terminal providing a differential control signal; and a switching device having an input terminal receiving an external supply voltage, an output terminal operatively coupled to the array power bus of the regulator circuit for providing the array supply voltage of the regulator circuit, and a control terminal operatively coupled to the output terminal of the differential amplifier for receiving the differential control signal, the differential control signal causing the switching device to increasingly and decreasingly provide an output current to its output terminal when the array supply voltage of the regulator circuit decreases and increases, respectively.

48. The voltage regulation system of claim 45 wherein the regulator circuit is constructed such that it can be turned off during stand-by cycles of the memory device, wherein the voltage regulation system further comprises a low-power regulator circuit operatively coupled to the array power bus for providing a regulated array supply voltage during stand-by cycles of the memory device while the other regulator circuit is off.

49. The voltage regulation system of claim 45 wherein the voltage regulation system further comprises a shorting circuit for operatively coupling the array power bus to an external supply voltage for a period of time at the beginning of active cycles of the memory device.

50. A voltage regulation system for a memory having a memory cell array and a control circuit, the voltage regulation system comprising:

a control circuit power bus operatively coupled to the control circuit for distributing a control circuit supply voltage to the control circuit; and a regulator circuit operatively coupled to the control circuit power bus at a plurality of respective spaced apart locations along the control circuit power bus for regulating and providing the control circuit supply voltage to the control circuit power bus at respective spaced apart locations.

51. The voltage regulation system of claim 50 wherein the regulator circuit comprises a plurality of voltage regulators which are separately connected to the control circuit power bus at respective spaced apart locations along the control circuit power bus.

52. The voltage regulation system of claim 50 wherein the regulator circuit comprises:

a differential amplifier circuit having a first input terminal operatively coupled to the control circuit power bus of the regulator circuit for receiving the control circuit supply voltage of the regulator circuit, a second input terminal receiving a reference voltage, and an output terminal providing a differential control signal; and a switching device having an input terminal receiving an external supply voltage, an output terminal operatively coupled to the control circuit power bus of the regulator circuit for providing the control circuit supply voltage of the regulator circuit, and a control terminal operatively coupled to the output terminal of the differential amplifier for receiving the differential control signal, the differential control signal causing the switching device to increasingly and decreasingly provide an output current to its output terminal when the control circuit supply voltage of the regulator circuit decreases and increases, respectively.

53. The voltage regulation system of claim 50 wherein the regulator circuit is constructed such that it can be turned off during stand-by cycles of the memory device, wherein the voltage regulation system further comprises a low-power regulator circuit operatively coupled to the control circuit power bus for providing a regulated control circuit supply voltage during stand-by cycles of the memory device while the other regulator circuit is off.

54. The voltage regulation system of claim 50 further comprising a shorting circuit for operatively coupling the control circuit power bus to an external supply voltage for a period of time at the beginning of active cycles of the memory device.

55. A method of supplying power to a memory device having a memory cell array, a control circuit operatively coupled to the memory cell array, an array power bus operatively coupled to the memory cell array for distributing an array supply voltage to the memory cell array, and a control circuit power bus operatively coupled to the control circuit for distributing a control circuit supply voltage to the control circuit, the method comprising separately providing the array supply voltage to the array power bus at a first location and the control circuit supply voltage to the control circuit power bus at a first location, the supply voltages being supplied to the array power bus and the control circuit power bus through first and second current paths, respectively, in a manner such that current supplied to the array power bus flows through current paths other than the control circuit power bus and current supplied to the control circuit power bus flows through current paths other than the array power bus.

56. The method of claim 55 further comprising the step of providing a second regulated array supply voltage to the array power bus at a location spaced apart from the first location.

57. The method of claim 55 further comprising the step of providing a second regulated control circuit supply voltage to the control circuit power bus at a location spaced apart from the first location.

58. The method of claim 55 further comprising the step of coupling at least one of the array and control circuit power busses to an external supply voltage for a period of time at the beginning of an active cycle of the memory device.

59. The method of claim 55 wherein the steps of providing the array supply voltage comprises comparing a voltage on the array power bus to respective a first reference voltage, and coupling the array power bus to an external supply voltage when the voltage on the array power bus is less than the first reference voltage, and wherein the step of providing the control circuit supply voltage comprises comparing a voltage on the control circuit power bus to a second reference voltage, and coupling the control circuit power bus to an external supply voltage when the voltage on the control circuit power bus is less than the second reference voltage.

60. The method of claim 55 further comprising discontinuing supplying the array supply voltage and the control circuit supply voltage to the array power bus and the control circuit power bus, respectively, during stand-by cycles of the memory device and supplying a low power supply voltage to either the array power bus or the control circuit power bus during stand-by cycles of the memory device.

61. The method of claim 60 further comprising the step of coupling the array power bus to the control circuit power bus during stand-by cycles of the memory device.

62. A method of supplying power to a memory device having a memory cell array and an array power bus operatively coupled to the memory cell array for distributing an array supply voltage to the memory cell array, the method comprising separately providing the array supply voltage to the array power bus at a plurality of spaced apart locations on the array power bus in a manner such that current supplied to the array power bus flows to the array power bus through a plurality of separate current paths.

63. The method of claim 62 further comprising the step of coupling the array power bus to an external supply voltage for a period of time at the beginning of an active cycle of the memory device.

64. The method of claim 62 wherein the steps of providing the array supply voltage comprises comparing a voltage on the array power bus to respective a first reference voltage, and coupling the array power bus to an external supply voltage when the voltage on the array power bus is less than the first reference voltage.

65. The method of claim 62 further comprising discontinuing supplying the array supply voltage to the array power bus during stand-by cycles of the memory device and supplying a low power supply voltage to the array power bus during stand-by cycles of the memory device.

66. A method of supplying power to a memory device having a memory cell array, a control circuit operatively coupled to the memory cell array, an array power bus operatively coupled to the memory cell array for distributing an array supply voltage to the memory cell array, and a control circuit power bus operatively coupled to the control circuit for distributing a control circuit supply voltage to the control circuit, the method comprising separately providing the control circuit supply voltage to the control circuit power bus at a plurality of spaced apart locations on the control circuit power bus in a manner such that current supplied to the control circuit power bus flows to the control circuit power bus through a plurality of separate current paths.

67. The method of claim 66 further comprising the step of coupling the control circuit power bus to an external supply voltage for a period of time at the beginning of an active cycle of the memory device.

68. The method of claim 66 wherein the steps of providing the control circuit supply voltage comprises comparing a voltage on the control circuit power bus to a second reference voltage, and coupling the control circuit power bus to an external supply voltage when the voltage on the control circuit power bus is less than the second reference voltage.

69. The method of claim 66 further comprising discontinuing supplying the control circuit supply voltage to the control circuit power bus during stand-by cycles of the memory device and supplying a low power supply voltage to the control circuit power bus during stand-by cycles of the memory device.

\* \* \* \* \*

UNITED STATES PATENT AND TRADEMARK OFFICE
CERTIFICATE OF CORRECTION

PATENT NO. : 5,818,780
DATED : October 6, 1998
INVENTOR(S) : Troy A. Manning

It is certified that error appears in the above-identified patent and that said Letters Patent is hereby corrected as shown below:

Column 6,
Line 46, "providing the reguilated" should read -- providing the regulated --

Column 10,
Line 16, "the computer of" should read -- the computer system of --

Column 12,
Line 34, "an output device," should read -- an output device; --
Line 40, "system comprising;" should read -- system comprising: --

Column 15,
Lines 29-30, "power bus at a respective" should read -- power bus at respective --
Line 61, "for a memory having" should read -- for a memory device having --

Column 17,
Line 9, "bus to respective a first" should read -- bus to a respective first --

Column 18,
Line 1, "bus to respective a first" should read -- bus to a respective first --

Signed and Sealed this

Eighth Day of February, 2005

JON W. DUDAS
*Director of the United States Patent and Trademark Office*